United States Patent
Yaguchi et al.

(10) Patent No.: US 6,519,741 B2
(45) Date of Patent: Feb. 11, 2003

(54) POWER DECOUPLING CIRCUIT GENERATING SYSTEM AND POWER DECOUPLING CIRCUIT GENERATING METHOD

(75) Inventors: Takahiro Yaguchi, Tokyo (JP); Kiyoshi Asao, Tokyo (JP); Hideki Sasaki, Tokyo (JP); Takashi Harada, Tokyo (JP)

(73) Assignee: NEC Corporation, Tokyo (JP)

( * ) Notice: Subject to any disclaimer, the term of this patent is extended or adjusted under 35 U.S.C. 154(b) by 90 days.

(21) Appl. No.: 09/764,282

(22) Filed: Jan. 19, 2001

(65) Prior Publication Data

US 2001/0010035 A1 Jul. 26, 2001

(30) Foreign Application Priority Data

Jan. 21, 2000 (JP) .................................. 2000-012904

(51) Int. Cl.[7] .............................................. G06F 17/50
(52) U.S. Cl. .............................................. 716/1; 716/8
(58) Field of Search ........................ 716/1–15; 307/89

(56) References Cited

U.S. PATENT DOCUMENTS

| | | | | |
|---|---|---|---|---|
| 4,434,396 A | * | 2/1984 | Montague | 323/230 |
| 5,764,491 A | * | 6/1998 | Tran | 174/260 |
| 5,834,994 A | * | 11/1998 | Shapiro | 333/185 |
| 5,956,246 A | * | 9/1999 | Sequeira et al. | 363/144 |
| 6,208,225 B1 | * | 3/2001 | Miller | 333/167 |
| 6,297,965 B1 | * | 10/2001 | Sasaki et al. | 307/89 |
| 2001/0014963 A1 | * | 8/2001 | Ando et al. | 716/1 |

FOREIGN PATENT DOCUMENTS

JP    2970660    8/1999

OTHER PUBLICATIONS

*Proceeding of the IEEE*, vol. 65, No. 11, Nov. 1977, pp. 1611–1612.

* cited by examiner

*Primary Examiner*—Vuthe Siek
*Assistant Examiner*—Sun James Lin
(74) *Attorney, Agent, or Firm*—Young & Thompson (57) ABSTRACT

Disclosed is a power decoupling circuit generating system and method capable of easily generating a power decoupling circuit for each device such as an LSI. On the basis of information regarding parameters of generating a power decoupling circuit held in a capacitor parts library and a line calculation parameter file, a power decoupling circuit of a π-type low pass filter construction having first and second decoupling capacitors to be added to a power supply terminal of a device as a target from which high frequency noise is prevented from being passed to a power plane and a power line corresponding to an inductance is automatically generated by a power decoupling circuit generating unit, thereby making calculation for generating the power decoupling circuit unnecessary.

16 Claims, 5 Drawing Sheets

POWER DECOUPLING CIRCUIT GENERATING SYSTEM AND POWER DECOUPLING CIRCUIT GENERATING METHOD

BACKGROUND OF THE INVENTION

The present invention relates to a power decoupling circuit generating system and a power decoupling circuit generating method adapted to automatically generate a power decoupling circuit for a device such as an LSI, aiming at prevention of passage of high frequency noise to a power plane.

PRIOR ART

Since the control of electromagnetic radiation on electric products is tough or very severe, samples of products are repeatedly measured and adjusted. It takes much time and the cost is so high. The cause of electromagnetic radiation in electric products is being tracked down and measures against the electromagnetic radiation at the designing stage of a printed board are being studied.

In the tracking down of the cause of the electromagnetic radiation and study of the measures, for example, a method of using electromagnetic radiation simulation is also being examined but a problem such that the method is not practical in terms of simulation accuracy and execution time arises.

Paying attention to resonance between the ground and a power plane as a large factor of electromagnetic radiation of a printed board, power decoupling methods of interrupting oscillation in a voltage and a current from a power supply terminal of a device such as an LSI as a cause of the resonance are being developed.

As an example of such methods, Japanese Patent Publication No. 2970660 discloses a technique that a π-type low pass filter as a power decoupling circuit in the form of a capacitor, a wire (inductance), and a capacitor is disposed between a power supply terminal of a device such as an LSI and a power plane.

Figure 5:
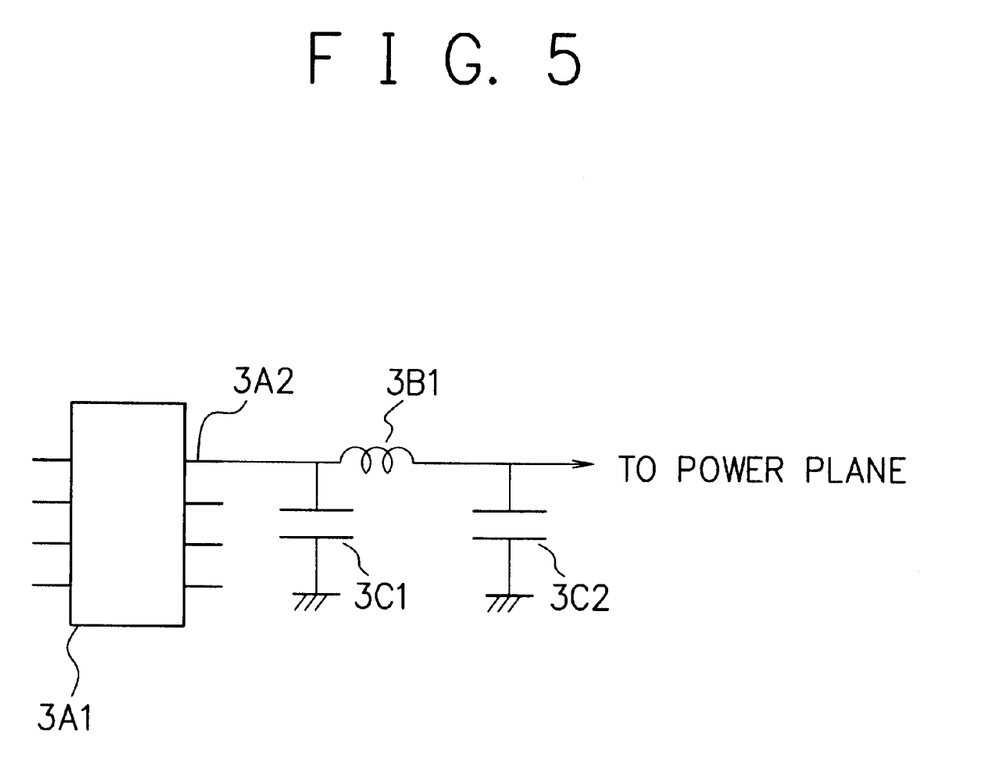
FIG. 5 shows an equivalent circuit showing a π-type low pass filter according to a conventional power decoupling method.

The π-type low pass filter is provided, for example, as shown in an equivalent circuit of FIG. 5, between a power supply terminal 3A2 of a device 3A1 such as an LSI and a power plane and is constructed by decoupling capacitors 3C1 and 3C2 and an inductance 3B1.

By providing a line having a component equivalent to the inductance 3B1 between the decoupling capacitors 3C1 and 3C2, a filter construction is obtained.

In the above-described prior art, however, it is necessary to calculate a line width and a line length of the line to realize the inductance 3B1 for each circuit constructing the π-type low pass filter as a power decoupling circuit. In the inductance 3B1 necessary for the device 3A1 such as an LSI, after providing a line with calculated line width and line length, it is necessary to manually dispose the decoupling capacitors 3C1 and 3C2 constructing the π-type low pass filter.

There is consequently a problem such that generation (designing) of a power decoupling circuit is extremely complicated.

SUMMARY OF THE INVENTION

The invention has been achieved in consideration of such circumstances and its object is to provide a power decoupling circuit generating system and power decoupling circuit generating method capable of easily generating a power decoupling circuit for each device such as an LSI.

According to the first aspect of the invention, there is provided a power decoupling circuit generating system having: a power decoupling circuit generating unit for generating a power decoupling circuit of a π-type low pass filter construction having first and second decoupling capacitors to be added to a power supply terminal of a device as a target from which high frequency noise is prevented from being passed to a power plane and a power line corresponding to an inductance; and information holding means for holding information regarding parameters of generating the power decoupling circuit, wherein the power decoupling circuit generating means automatically generates a power decoupling circuit to be added to the power supply terminal of the device on the basis of the information of the information holding means.

The power decoupling circuit generating unit can have: a power supply terminal information setting unit for selecting a power supply terminal of the device and adding parameters of generating the power decoupling circuit to the power supply terminal on the basis of the information of the information holding means; a power line calculating unit for calculating a line width and a line length of the power line in the power decoupling circuit; and a decoupling circuit arranging unit for laying the power line based on the calculated line width and line length, disposing the first decoupling capacitor based on the parameters added by the power supply terminal information setting unit to the power supply terminal side of the power line, and disposing the second decoupling capacitor on the side opposite to the power supply terminal of the power line.

The information holding means can have: a capacitor parts library in which shapes of capacitor parts of the first and second decoupling capacitors to be added and frequency characteristics of the capacitor parts are defined; and a line calculation parameter file in which a dielectric constant of a material used for an insulator of a printed board on which the device is mounted and a layer configuration of the printed board are defined.

In the capacitor parts library, information indicative of a series inductance and a series resistance of the capacitor part itself, an inductance of a pad for mounting the capacitor, and an inductance of a via hole for connecting the pad and a power layer and a ground layer on the inside can be included. In the line calculation parameter file, information indicative of a ratio between a characteristic impedance of the power line and impedances of the first and second decoupling capacitors can be included.

At the time of calculating a line width and a line length of the power line, the power line calculating unit can use an operating frequency of the device as a target set by the power supply terminal information setting unit, characteristics of the first and second decoupling capacitors constructing the power decoupling circuit, a dielectric constant of an insulator of a printed board defined in the line calculation parameter file, and layer configuration information of the printed board.

When parameters of generating the power decoupling circuit are added to the power supply terminal, the power supply terminal information setting unit can select a capacitor having a parasitic inductance as small as possible, defined in the capacitor parts library.

The power supply terminal information setting unit can add parameters of generating the power decoupling circuit to a plurality of power supply terminals of the device on the basis of the information in the information holding means, the power line calculating unit can calculate a line width and a line length of the power line laid among the plurality of power terminals, and the decoupling circuit arranging unit can lay the power line based on the calculated line width and line length and dispose, in addition to the first and second decoupling capacitors based on the parameters added by the power supply terminal information setting unit, third and fourth decoupling capacitors to the power supply terminal side on which the first and second decoupling capacitors are not disposed.

According to the tenth aspect of the invention, there is provided a power decoupling circuit generating method including: a first step of generating a power decoupling circuit of a π-type low pass filter construction having first and second decoupling capacitors to be added to a power supply terminal of a device as a target from which high frequency noise is prevented from being passed to a power plane and a power line corresponding to an inductance by a power decoupling circuit generating unit; and a second step of holding information regarding parameters of generating the power decoupling circuit in information holding means, wherein a power decoupling circuit to be added to the power supply terminal of the device is automatically generated by the power decoupling circuit generating means on the basis of the information of the information holding means.

The first step can include: a third step of selecting a power supply terminal: of the device and adding parameters of generating the power decoupling circuit to the power supply terminal on the basis of the information of the information holding means by a power supply terminal information setting unit; a fourth step of calculating a line width and a line length of the power line in the power decoupling circuit by a power line calculating unit; and a fifth step of laying the power line based on the calculated line width and line length, disposing the first decoupling capacitor based on the parameters added by the power supply terminal information setting unit to the power supply terminal side of the power, line, and disposing the second decoupling capacitor on the side opposite to the power supply terminal of the power line by a decoupling circuit arranging unit.

The second step can include: a sixth step of defining shapes of capacitor parts of the first and second decoupling capacitors to be added and frequency characteristics of the capacitor parts in a capacitor parts library; and a seventh step of defining a dielectric constant of a material used for an insulator of a printed board on which the device is mounted and a layer configuration of the printed board in a line calculation parameter file.

The sixth step can include an eighth step of including information indicative of a series inductance and a series resistance of the capacitor part itself, an inductance of a pad for mounting the capacitor, and an inductance of a via hole for connecting the pad and a power layer and a ground layer on the inside in the capacitor parts library, and the seventh step can include a ninth step of including information indicative of a ratio between a characteristic impedance of the power line and impedances of the first and second decoupling capacitors in the line calculation parameter file.

The fourth step can include a tenth step of, at the time of calculating a line width and a line length of the power line, using an operating frequency of the device as a target set by the power supply terminal information setting unit, characteristics of the first and second decoupling capacitors constructing the power decoupling circuit, a dielectric constant of an insulator of a printed board defined in the line calculation parameter file, and layer configuration information of the printed board.

The third step can include an eleventh step of, when parameters of generating the power decoupling circuit are added to the power supply terminal, selecting a capacitor having a parasitic inductance as small as possible, defined in the capacitor parts library.

The third step can include a twelfth step of adding parameters of generating the power decoupling circuit to a plurality of power supply terminals of the device on the basis of the information in the information holding means, the fourth step can include a thirteenth step of calculating a line width and a line length of the power line laid among the plurality of power terminals, and the fifth step can include a fourteenth step of laying the power line based on the calculated line width and line length and disposing, in addition to arrangement of the first and second decoupling capacitors based on the parameters added by the power supply terminal information setting unit, third and fourth decoupling capacitors to the power supply terminal side on which the first and second decoupling capacitors are not disposed.

In the power decoupling circuit generating system and the power decoupling circuit generating method according to the invention, on the basis of information regarding parameters of generating a power decoupling circuit held in the information holding means, a power decoupling circuit of a π-type low pass filter has a construction having first and second decoupling capacitors to be added to a power supply terminal of a device as a target from which high frequency noise is prevented from being passed to a power plane and a power line corresponding to an inductance is automatically generated by a power decoupling circuit generating unit, thereby making calculation for generating the power decoupling circuit unnecessary.

DETAILED DESCRIPTION OF THE PREFERRED EMBODIMENTS

Embodiments of the invention will be described hereinbelow.

First Embodiment

Figure 1:
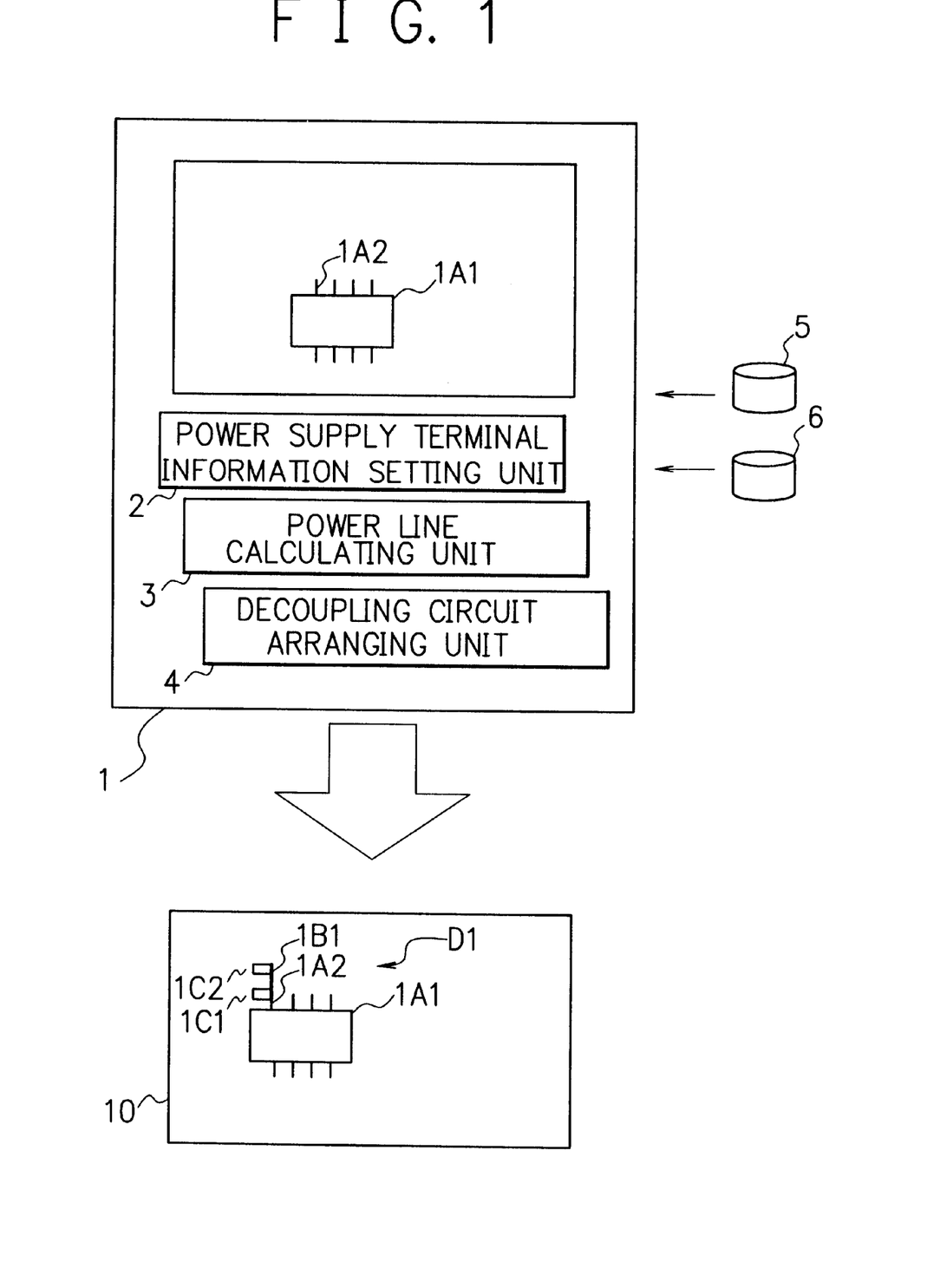
FIG. 1 is a diagram showing a first embodiment of a power decoupling circuit generating system of the present invention.
Figure 2:
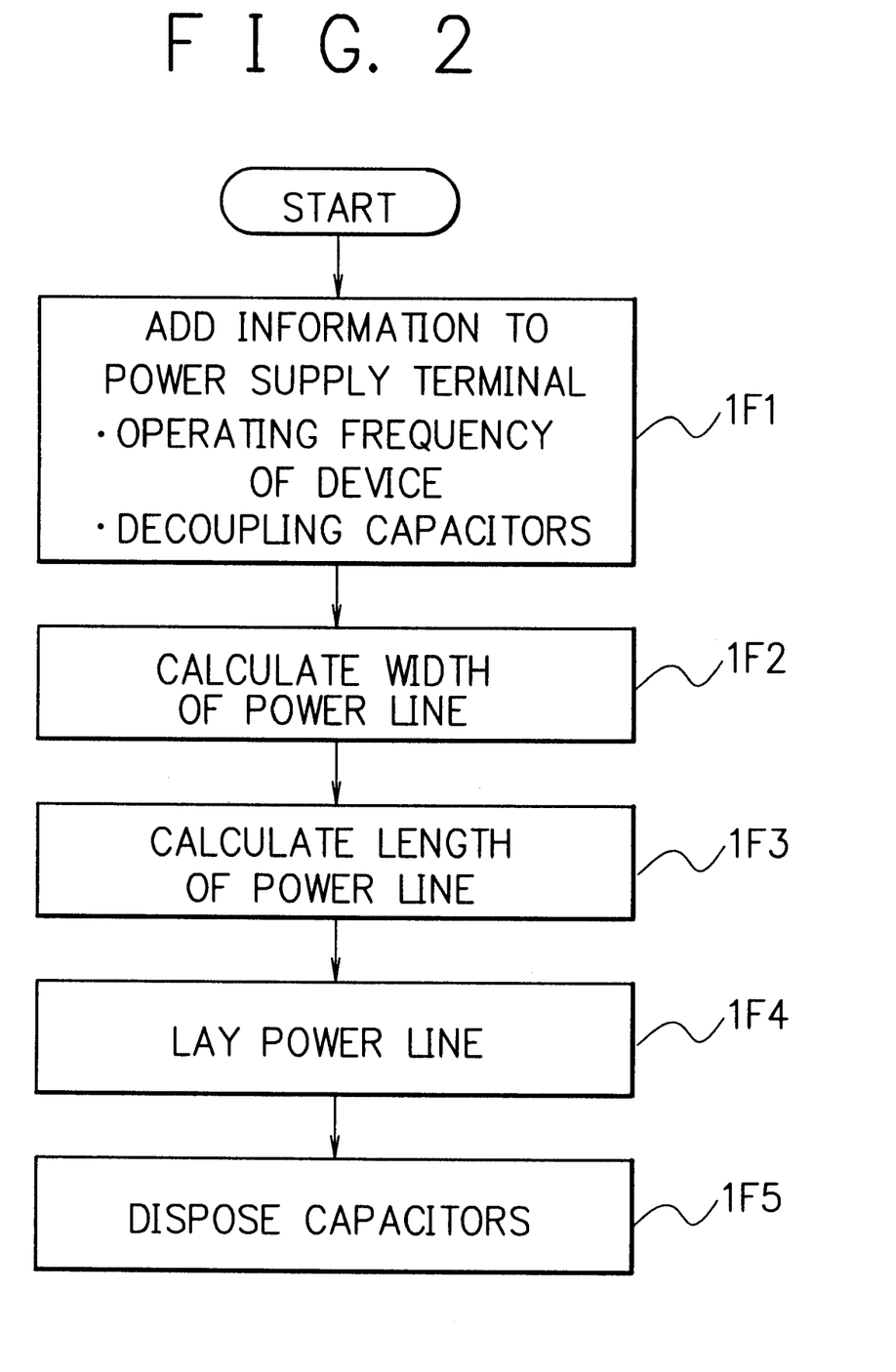
FIG. 2 is a flowchart for explaining the operation of the power decoupling g circuit generating system of FIG. 1.

FIG. 1 is a diagram showing a first embodiment of a power decoupling circuit generating system. FIG. 2 is a flowchart for explaining the operation of the power decoupling circuit generating system of FIG. 1.

A power decoupling circuit generating system shown in FIG. 1 has a power decoupling circuit generating unit 1, a capacitor parts library 5, and a line calculation parameter file 6. The capacitor parts library 5 and the line calculation parameter file 6 are information holding means for holding information regarding parameters of generating a power decoupling circuit D1 which will be described hereinlater.

The power decoupling circuit generating unit 1 as power decoupling circuit generating means is to generate a power decoupling circuit added device 10 to which the power decoupling circuit D1 for a power supply terminal 1A2 of a device 1A1 such as an LSI as a target is automatically added. The power decoupling circuit generating unit 1 has a power supply terminal information setting unit 2, a power line calculating unit 3, and a decoupling circuit arranging unit 4. The power decoupling circuit D1 has a π-type low pass filter construction.

The power supply terminal information setting unit 2 selects the power supply terminal 1A2 of the device 1A1 such as an LSI as a target from which high frequency noise is prevented from being passed to the power plane, and adds the parameters of generating the power decoupling circuit D1 to the power supply terminal 1A2.

Information to be added to the power supply terminal 1A2 is kinds of parts of decoupling capacitors 1C1 and 1C2 constructing the power decoupling circuit D1, operating frequency of the device 1A1 as a target, and the like. The decoupling capacitors 1C1 and 1C2 correspond to first and second decoupling capacitors. In the case of designating the decoupling capacitors 1C1 and 1C2, they are selected from capacitors defined in the capacitor parts library 5 which will be described hereinlater.

Further, in the case of designating the decoupling capacitors 1C1 and 1C2, capacitors of which parasitic inductances are as small as possible are selected from capacitors defined in the capacitor parts library 5.

Specifically, on the basis of the operating frequency of the device 1A1 such as an LSI as a target, whether the impedance of the capacitor at the operating frequency is sufficiently smaller than an impedance of an inductance component of a power line 1B1 or not can be known.

In other words, when the operating frequency is higher than a resonance frequency of the capacitor, the impedance of the capacitor depends on the parasitic inductance of the capacitor. Therefore, sufficiently small impedance of the capacitor is equivalent to sufficiently small parasitic inductance of the capacitor.

The power line calculating unit 3 calculates a line width and a line length of the power line 1B1 corresponding to the inductance of the power decoupling circuit D1. For the calculation of the line width and line length, the operating frequency of the device 1A1 as a target set by the power supply terminal information setting unit 2, characteristics of the decoupling capacitors 1C1 and 1C2 constructing the power decoupling circuit D1, a dielectric constant of an insulator of a printed board defined in the line calculation parameter file 6 which will be described hereinlater, and layer configuration information of a printed board are used.

The decoupling circuit arranging unit 4 lays the power line 1B1 based on the line width and line length calculated by the power line calculating unit 3, disposes the decoupling capacitor 1C1 designated by the power supply terminal information setting unit 2 to the power supply terminal 1A2 side of the power line 1B1, and disposes the decoupling capacitor 1C2 on the side opposite to the power supply terminal 1A2 of the power line 1B1.

In the capacitor parts library 5, (1) shapes of capacitor parts and (2) frequency characteristics of capacitor parts are defined. It is assumed that the frequency characteristics of a capacitor necessary for calculation of the system include not only the capacitor as a part itself but also a series inductance and a series resistance of the capacitor itself, an inductance of a pad for mounting the capacitor, and an inductance of a via hole connecting the pad and a power layer and a ground layer on the inside.

The capacitor part used in practice has not only a capacitor value but also a parasitic inductance value and a resistance value. That is, in a high frequency range, since the parasitic inductance component of the capacitor appears, the above information is necessary.

In the line calculation parameter file 6, (1) a dielectric constant of a material of an insulator in a printed board, and (2) a layer structure (substrate thickness, thickness of a conductor, and the like) of the printed board are defined.

In order to determine the line width of the power line 1B1, the characteristic impedance of the power supply line 1B1 has to be sufficiently higher than the impedance of the decoupling capacitor 1C1. Consequently, (3) the ratio between the characteristic impedance of the power line 1B1 and the impedance of the decoupling capacitor 1C1 is also defined in the line calculation parameter file 6.

The operation of the power decoupling circuit generating system having such a construction will now be described.

First, as shown in FIG. 2, information necessary to generate the power decoupling circuit D1 is set in the power supply terminal 1A2 in the device 1A1 to which the power decoupling circuit D1 is added (step 1F1).

In this case, the power supply terminal information setting unit 2 in FIG. 1 selects the power supply terminal 1A2 of the device 1A1 as a target to which the power decoupling circuit D1 is added. Parts of the decoupling capacitors 1C1 and 1C2 used for the power decoupling circuit D1 to be added to the power supply terminal 1A2 are selected.

The parts of the decoupling capacitors 1C1 and 1C2 are selected from the group of capacitor parts described in the capacitor parts library 5. The operating frequency of the device 1A1 as a target is designated as information of the power supply terminal 1A2.

Then, the line width of the power line 1B1 is calculated by the power line calculating unit 3 (step 1F2). The method of calculating the line width is as follows.

Specifically, the power line 1B1 is set so as to function as an inductance of a π-type low pass filter as the power decoupling circuit D1. At the operating frequency of the device 1A1, the inductance is set to have a value as an impedance ratio, which is N times as high as the impedance of the decoupling capacitor 1C1. By the arrangement, high frequency noise of the power supply terminal 1A2 can be prevented from being passed to the power plane. The impedance ratio N is preliminarily defined in the line calculation parameter file 6.

From an operating frequency F added to the power supply terminal 1A2 by the power supply terminal information setting unit 2 and the frequency characteristic of the decoupling capacitor 1C1 similarly designated, an impedance ZC at the time of the operating frequency F of the decoupling capacitor 1C1 is obtained from the capacitor parts library 5. The characteristic impedance Z0 of the power line 1B1 is calculated by Z0πZC×N.

Referring to the expressions for obtaining characteristic impedance of a line described in the literature "PROCEEDING OF THE IEEE, VOL. 65, NO. 11, NOVEMBER 1977, pp. 1611 to 1612", the line width necessary for realizing the characteristic impedance of Z0 is specified.

The expressions described in the literature are as follows.

$$Z0 = 60/\sqrt{(\epsilon\ \mathit{reff})} \ln\{(8/We/h) + 0.25(We/h)\}$$

(when W/h<1)

$$Z0 = 120\pi/\sqrt{(\epsilon\ \mathit{reff})} \{(We/h) + 1.393 + 0.6671n((We/h) + 1.444)\}^{-1}$$

(when W/h>1)

The length of the power line 1B1 is calculated by the power line calculating unit 3 (step 1F3). When the length of the power line 1B1 is too short, it does not function as an inductance, so that a certain length is necessary. Preferably, the power line length is set to 20 [mm]×√ (dielectric constant) or longer as described in Japanese Patent Publication No. 2970660.

On the basis of the line width and the line length calculated as described above, the power line 1B1 is laid (step 1F4). The power line 1B1 having the length calculated (in step 1F3) and the width calculated (in step 1F2) is laid (wired) from the power supply terminal 1A2 to which the power decoupling circuit D1 is added so as to be apart from the device 1A1.

Finally, the decoupling capacitors 1C1 and 1C2 are disposed (step 1F5). The decoupling capacitor 1C1 is disposed on the power supply terminal 1A2 side of the power line 1B1. The decoupling capacitor 1C2 is disposed on the side opposite to the power terminal 1A2 side of the power line 1B1.

As described above, in the first embodiment, on the basis of the information regarding the parameters of generating the power decoupling circuit D1 held in the capacitor parts library 5 and the line calculation parameter file 6, the power decoupling circuit D1 having the π-type low pass filter construction of the decoupling capacitors 1C1 and 1C2 to be added to the power supply terminal 1A2 of the device 1A1 as a target from which high frequency noise is prevented from being passed to the power plane and the power line 1B1 corresponding to the inductance is automatically generated by the power decoupling circuit generating unit 1, thereby making the calculation for generating the power decoupling circuit D1 unnecessary. Consequently, the power decoupling circuit D1 for each device 1A1 such as an LSI can be easily generated.

Second Embodiment

Figure 3:
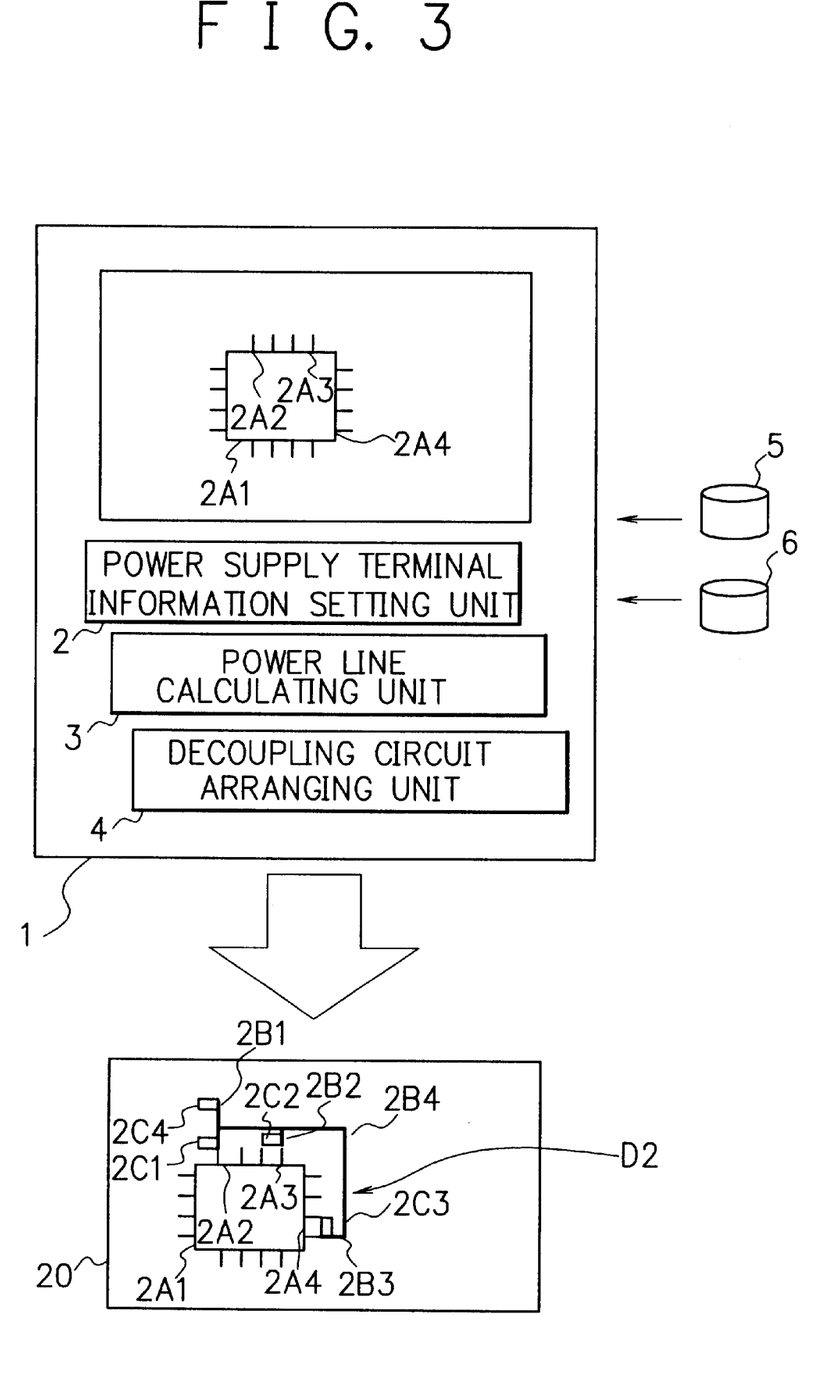
FIG. 3 is a diagram showing a second embodiment of a power decoupling circuit generating system of the invention.
Figure 4:
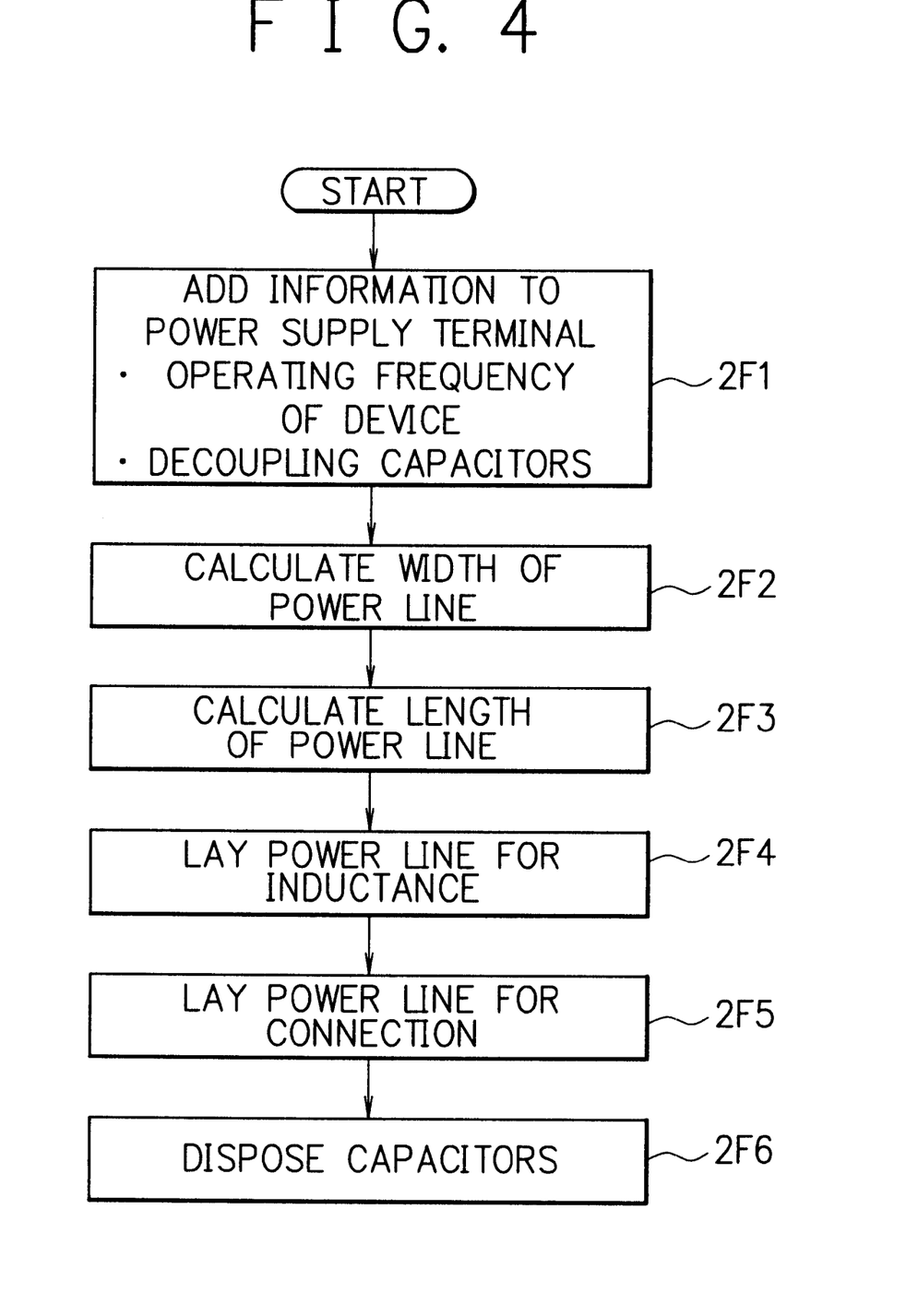
FIG. 4 is a flowchart for explaining the operation of the power decoupling circuit generating system of FIG. 3.

FIG. 3 shows a second embodiment of a power decoupling circuit generating system of the invention. FIG. 4 is a flowchart for explaining the operation of the power decoupling circuit generating system of FIG. 3. In the diagrams described hereinbelow, the same components as those in FIG. 1 are designated by the same reference numerals and repetitive description will be omitted.

In the second embodiment, one power decoupling circuit is added to a plurality of power supply terminals of a device as a target.

Namely, the power decoupling circuit generating system shown in FIG. 3 has the power decoupling circuit generating unit 1, capacitor parts library 5, and line calculating parameter file 6. The power decoupling circuit generating unit 1 is to generate a power decoupling circuit added device 20 to which a power decoupling circuit (π-type low pass filter) D2 for a plurality of power supply terminals 2A2 to 2A4 of a device 2A1 such as an LSI from which high-frequency noise is prevented from being passed to the power plane is automatically added. As described above, the power decoupling circuit generating unit 1 has the power terminal information setting unit 2, power line calculating unit 3, and decoupling circuit arranging unit 4.

The power decoupling circuit added device 20 has a configuration in which the power decoupling circuit D2 constructed by decoupling capacitors 2C1 to 2C4 and power lines 2B1 to 2B4 is added to the plurality of power supply terminals 2A2 to 2A4. The decoupling capacitors 2C1 and 2C4 correspond to first and second decoupling capacitors and the decoupling capacitors 2C2 and 2C3 correspond to third and fourth decoupling capacitors.

The power decoupling circuit generating system having such a configuration performs operations as described hereinbelow.

First, information necessary to generate the power decoupling circuit D2 is set in the power supply terminals 2A2 to 2A4 of the device 2A1 as a target (step 2F1).

In this case, first, the power supply terminal 2A2 of the device 2A1 as a target to which the power decoupling circuit D2 is added is selected by the power supply terminal information setting unit 2. Parts of the decoupling capacitors 2C1 and 2C4 in the power decoupling circuit D2 to be added to the power supply terminal 2A2 are selected. At this time, the parts of the decoupling capacitors 2C1 and 2C4 are selected from a group of capacitor parts described in the capacitor parts library 5.

In operating frequencies of the device 2A1 as a target, the operating frequency related to the power supply terminal 2A2 is set as information of the power supply terminal 2A2. Similarly, the power supply terminal 2A3 is selected, and the part of the decoupling capacitor 2C2 is also selected. In the operating frequencies of the device 2A1 as a target, the frequency related to the power supply terminal 2A3 is set as the information of the power supply terminal 2A3.

Further, similarly, the power supply terminal 2A4 is selected, and the part of the decoupling capacitor 2C3 is selected. In the operating frequencies of the device 2A1 as a target, a frequency related to the power supply terminal 2A4 is set as information of the power supply terminal 2A4.

Subsequently, by the power line calculating unit 3, the line width of each of the power lines 2B1 to 2B4 is calculated (step 2F2). An example of the method of calculating a line width is as follows.

That is, the power line 2B1 functions as an inductance of a π-type low pass filter as the power decoupling circuit D2. At the operating frequency related to each of the power supply terminals 2A2 to 2A4 of the device 2A1, the inductance has a value which is N times, as an impedance ratio, as high as an impedance of each of the decoupling capacitors 2C1 to 2C4 of the power supply terminals 2A2 to 2A4. By the arrangement, noise as a high frequency component of each of the power supply terminals 2A2 to 2A4 can be prevented from being passed to the power plane.

The impedance of the decoupling capacitor 2C1 at a frequency set as information of the power supply terminal 2A2, the impedance of the decoupling capacitor 2C2 at a frequency set as information of the power supply terminal 2A3, and the impedance of the decoupling capacitor 2C3 at a frequency set as information of the power supply terminal 2A4 are obtained from the capacitor parts library 5.

Among the three impedances, the highest impedance is set as ZC. The impedance ratio N is preliminarily defined in the line calculation parameter file 6.

The characteristic impedance Z0 of the power lines 2B1 to 2B4 is calculated as Z0=ZC×N.

Referring to the expressions for obtaining the characteristic impedances of lines as described in the literature "PROCEEDING OF THE IEEE, VOL. 65, NO. 11, NOVEMBER, 1977, pp. 1611 to 1612", a line width necessary to realize the characteristic impedance of Z0 is specified.

Subsequently, the length of the power line 2B1 is calculated by the power line calculating unit 3 (step 2F3). When the length of the power line 2B1 is too short, it does not function as an inductance, so that a certain length is necessary as described above. The power line length is preferably set to 20 [mm]×√ F (dielectric constant) or larger. On the basis of the line width and the line length calculated as described above, a line is laid (step 2F4).

In the power supply terminals 2A2 to 2A4 of the device 2A1 as a target to which the power decoupling circuit D2 is added, the power line 2B1 having a length calculated in step 2F3 and a width calculated in step 2F2 is laid from the power supply terminal 2A2 which designates the two decoupling capacitors 2C1 and 2C4 toward the outside of the device 2A1. The power line 2B1 corresponds to the inductance component of the power decoupling circuit D2.

From the other power supply terminals 2A3 and 2A4, the power lines 2B2 to 2B4 to be connected to the power line 2B1 as an inductance component are led (step 2F5).

In this case, the power line 2B2 having a width calculated (in step 2F2) and a, line length long enough to dispose the decoupling capacitor 2C2 is laid from the power supply terminal 2A3.

Similarly, the power line 2B3 having a width calculated (in step 2F2) and a line length long enough to dispose the decoupling capacitor 2C3 is laid from the power supply terminal 2A4.

After that, the power line 2B4 having a width calculated (in step 2F2) is laid so as to connect the power lines 2B2 and 2B3 and the power supply terminal 2A2 side of the power line 2B1. Finally, the decoupling capacitors 2(1 to 2C4 are disposed (step 2F6).

To be specific, the decoupling capacitor 2C1 is disposed on the power supply terminal 2A2 side of the power line 2B1, the decoupling capacitor 2C2 is disposed on the power supply terminal 2A3 side of the power line 2B2, and the decoupling capacitor 2C3 is disposed on the power supply terminal 2A4 side of the power line 2B3. The decoupling capacitor 2C4 is disposed on the side opposite to the power supply terminal 2A2 of the power line 2B1. By the above operation, the power decoupling circuit added device 20 is generated.

As described above, in the second embodiment, on the basis of information regarding the parameters of generating the power decoupling circuit D2 held in the capacitor parts library 5 and the line calculating parameter file 6, the power decoupling circuit D2 having: a π-type low pass filter of the decoupling capacitors 2C1 to 2C4 to be added to the power supply terminals 2A2 to 2A4 of the device 2A1 as a target from which high frequency noise is prevented from being passed to the power plane and the power line 2B1 corresponding to the inductance; and the power lines 2B1 to 2B4 disposed among the power supply terminals 2A2 to 2A4 is automatically generated by the power decoupling circuit generating unit 1, thereby making calculation for generating the power decoupling circuit D2 unnecessary. Thus, the power decoupling circuit D2 can be easily generated for each device 2A1 such as an LSI, and the number of decoupling capacitors 2C1 to 2C4 to be added to the plurality of power supply terminals 2A2 to 2A4 can be minimized.

In the power decoupling circuit generating system and power decoupling circuit generating method according to the present invention as described above, on the basis of the information regarding the parameters of generating the power decoupling circuit held in the information, holding means, the power decoupling circuit of the π-type low pass filter construction having: the first and second decoupling capacitors to be added to a power supply terminal of a device as a target from which high frequency noise is prevented from being passed to the power plane; and the power line corresponding to the inductance is automatically generated, thereby making the calculation for generating the power decoupling circuit unnecessary. Thus, the power decoupling circuit can be easily generated for each device such as an LSI.

What is claimed is:

1. A power decoupling circuit generating system comprising:

a power decoupling circuit generating unit for generating a power decoupling circuit of a π-type low pass filter construction having first and second decoupling capacitors to be added to a power supply terminal of a device as a target from which high frequency noise is prevented from being passed to a power plane and a power line corresponding to an inductance; and an information holding means for holding information regarding parameters of generating said power decoupling circuit, wherein said power decoupling circuit generating means automatically generates a power decoupling circuit to be added to the power supply terminal of said device on the basis of the information of said information holding means.

2. A power decoupling circuit generating system comprising:

a power decoupling circuit generating unit for generating a power decoupling circuit of a π-type low pass filter construction having first and second decoupling capacitors to be added to a power supply terminal of a device as a target from which high frequency noise is prevented from being passed to a power plane and a power line corresponding to an inductance; and an information holding means for holding information regarding parameters of generating said power decoupling circuit, wherein said power decoupling circuit generating means automatically generates a power decoupling circuit to be added to the power supply, terminal of said device on the basis of the information of said information holding means and;

said power decoupling circuit generating unit comprises:

a power supply terminal information setting unit for selecting a power supply terminal of said device and adding parameters of generating said power decoupling circuit to said power supply terminal on the basis of the information of said information holding means;

a power line calculating unit for calculating a line width and a line length of the power line in said power decoupling circuit; and a decoupling circuit arranging unit for laying said power line based on said calculated line width and line length, disposing said first decoupling capacitor based on the parameters added by said power supply terminal information setting unit to the power supply terminal side of said power line, and disposing said second decoupling capacitor on the side opposite to said power supply terminal of said power line.

3. The power decoupling circuit generating system according to claim 2, wherein at the time of calculating a line width and a line length of said power line, said power line calculating unit uses an operating frequency of said device as a target set by said power supply terminal information setting unit, characteristics of said first and second decoupling capacitors constructing said power decoupling circuit, a dielectric constant of an insulator of a printed board defined in said line calculation parameter file, and layer configuration information of said printed board.

4. The power decoupling circuit generating system according to claim 2, wherein when parameters of generating said power decoupling circuit are added to said power supply terminal, said power supply terminal information setting unit selects a capacitor having a parasitic inductance as small as possible, defined in said capacitor parts library.

5. The power decoupling circuit generating system according to claim 2, wherein said power supply terminal information setting unit adds parameters of generating said power decoupling circuit to a plurality of power supply terminals of said device on the basis of the information in said information holding means, said power line calculating unit calculates a line width and a line length of said power line laid among said plurality of power terminals, and said decoupling circuit arranging unit lays said power line based on said calculated line width and line length and disposes, in addition to said first and second decoupling capacitors based on the parameters added by said power supply terminal information setting unit, third and fourth decoupling capacitors to said power supply terminal side on which said first and second decoupling capacitors are not disposed.

6. A power decoupling circuit generating system comprising:

a power decoupling circuit generating unit for generating a power decoupling circuit of a π-type low pass filter construction having first and second decoupling capacitors to be added to a power supply terminal of a device as a target from which high frequency noise is prevented from being passed to a power plane and a power line corresponding to an inductance; and an information holding means for holding information regarding parameters of generating said power decoupling circuit, wherein said power decoupling circuit generating means automatically generates a power decoupling circuit to be added to the power supply terminal of said device on the basis of the information of said information holding means;

said power decoupling circuit generating unit comprises:

a power supply terminal information setting unit for selecting a power supply terminal of said device and adding parameters of generating said power decoupling circuit to said power supply terminal on the basis of the information of said information holding means;

a power line calculating unit for calculating a line width and a line length of the power line in said power decoupling circuit; and a decoupling circuit arranging unit for laying said power line based on said calculated line width and line length, disposing said first decoupling capacitor based on the parameters added by said power supply terminal information setting unit to the power supply terminal side of said power line, and disposing said second decoupling capacitor on the side opposite to said power supply terminal of said power line, and said information holding means comprises:

a capacitor parts library in which shapes of capacitor parts of said first and second decoupling capacitors to be added and frequency characteristics of said capacitor parts are defined; and a line calculation parameter file in which a dielectric constant of a material used for an insulator of a printed board on which said device is mounted and a layer configuration of said printed board are defined.

7. The power decoupling circuit generating system according to claim 6, wherein information indicative of a series inductance and a series resistance of said capacitor part itself, an inductance of a pad for mounting the capacitor, and an inductance of a via hole for connecting the pad and a power layer and a ground layer on the inside is included in said capacitor parts library, and information indicative of a ratio between a characteristic impedance of said power line and impedances of said first and second decoupling capacitors is included in said line calculation parameter file.

8. A power decoupling circuit generating system comprising:

a power decoupling circuit generating unit for generating a power decoupling circuit of a π-type low pass filter construction having first and second decoupling capacitors to be added to a power supply terminal of a device as a target from which high frequency noise is prevented from being passed to a power plane and a power line corresponding to an inductance; and an information holding means for holding information regarding parameters of generating said power decoupling circuit, wherein said power decoupling circuit generating means automatically generates a power decoupling circuit to be added to the power supply terminal of said device on the basis of the information of said information holding means and;

said information holding means comprises:

a capacitor parts library in which shapes of capacitor parts of said first and second decoupling capacitors to be added and frequency characteristics of said capacitor parts are defined; and a line calculation parameter file in which a dielectric constant of a material used for an insulator of a printed board on which said device is mounted and a layer configuration of said printed board are defined.

9. The power decoupling circuit generating system according to claim 8, wherein information indicative of a series inductance and a series resistance of said capacitor part itself, an inductance of a pad for mounting the capacitor, and an inductance of a via hole for connecting the pad and a power layer and a ground layer on the inside is included in said capacitor parts library, and information indicative of a ratio between a characteristic impedance of said power line and impedances of said first and second decoupling capacitors is included in said line calculation parameter file.

10. A power decoupling circuit generating method comprising:

a first step of generating a power decoupling circuit of a π-type low pass filter construction having first and second decoupling capacitors to be added to a power supply terminal of a device as a target from which high frequency noise is prevented from being passed to a power plane and a power line corresponding to an inductance by a power decoupling circuit generating unit; and a second step of holding information regarding parameters of generating said power decoupling circuit in information holding means, wherein a power decoupling circuit to be added to the power supply terminal of said device is automatically generated by said power decoupling circuit generating means on the basis of the information of said information holding means.

11. A power decoupling circuit generating method comprising:
  a first step of generating a power decoupling circuit of a π-type low pass filter construction having first and second decoupling capacitors to be added to a power supply terminal of a device as a target from which high frequency noise is prevented from being passed to a power plane and a power line corresponding to an inductance by a power decoupling circuit generating unit; and
  a second step of holding information regarding parameters of generating said power decoupling circuit in information holding means,
  wherein a power decoupling circuit to be added to the power supply terminal of said device is automatically generated by said power decoupling circuit generating means on the basis of the information of said information holding means;
  said first step includes:
    a third step of selecting a power supply terminal of said device and adding parameters of generating said power decoupling circuit to said power supply terminal on the basis of the information of said information holding means by a power supply terminal information setting unit;
    a fourth step of calculating a line width and a line length of the power line in said power decoupling circuit by a power line calculating unit; and
    a fifth step of laying said power line based on said calculated line width and line length, disposing said first decoupling capacitor based on the parameters added by said power supply terminal information setting unit to the power supply terminal side of said power line, and disposing said second decoupling capacitor on the side opposite to said power supply terminal of said power line by a decoupling circuit arranging unit.

12. The power decoupling circuit generating method according to claim 11, wherein said fourth step includes a tenth step of, at the time of calculating a line width and a line length of said power line, using an operating frequency of said device as a target set by said power supply terminal information setting unit, characteristics of said first and second decoupling capacitors constructing said power decoupling circuit, a dielectric constant of an insulator of a printed board defined in said line calculation parameter file, and layer configuration information of said printed board.

13. The power decoupling circuit generating method according to claim 11, wherein said third step includes an eleventh step of, when parameters of generating said power decoupling circuit are added to said power supply terminal, selecting a capacitor having a parasitic inductance as small as possible, defined in said capacitor parts library.

14. The power decoupling circuit generating method according to claim 11, wherein said third step includes a twelfth step of adding parameters of generating said power decoupling circuit to a plurality of power supply terminals of said device on the basis of the information in said information holding means,
  said fourth step includes a thirteenth step of calculating a line width and a line length of said power line laid among said a plurality of power terminals, and
  said fifth step includes a fourteenth step of laying said power line based on said calculated line width and line length and disposing, in addition to arrangement of said first and second decoupling capacitors based on the parameters added by said power supply terminal information setting unit, third and fourth decoupling capacitors to said power supply terminal side on which said first and second decoupling capacitors are not disposed.

15. A power decoupling circuit generating method comprising:
  a first step of generating a power decoupling circuit of a π-type low pass filter construction having first and second decoupling capacitors to be added to a power supply terminal of a device as a target from which high frequency noise is prevented from being passed to a power plane and a power line corresponding to an inductance by a power decoupling circuit generating unit; and
  a second step of holding information regarding parameters of generating said power decoupling circuit in information holding means,
  wherein a power decoupling circuit to be added to the power supply terminal of said device is automatically generated by said power decoupling circuit generating means on the basis of the information of said information holding means, and
  said second step includes:
    a sixth step of defining shapes of capacitor parts of said first and second decoupling capacitors to be added and frequency characteristics of said capacitor parts in a capacitor parts library; and
    a seventh step of defining a dielectric constant of a material used for an insulator of a printed board on which said device is mounted and a layer configuration of said printed board in a line calculation parameter file.

16. The power decoupling circuit generating method according to claim 15, wherein said sixth step includes an eighth step of including information indicative of a series inductance and a series resistance of said capacitor part itself, an inductance of a pad for mounting the capacitor, and an inductance of a via hole for connecting the pad and a power layer and a ground layer on the inside, and
  said seventh step includes a ninth step of including information indicative of a ratio between a characteristic impedance of said power line and impedances of said first and second decoupling capacitors.

* * * * *